United States Patent [19]
Wakefield

[11] Patent Number: 5,819,398
[45] Date of Patent: Oct. 13, 1998

[54] METHOD OF MANUFACTURING A BALL GRID ARRAY PACKAGE

[75] Inventor: Elwyn Wakefield, Bristol, United Kingdom

[73] Assignee: SGS-Thomson Microelectronics, Ltd., Bristol, United Kingdom

[21] Appl. No.: 690,066

[22] Filed: Jul. 31, 1996

[30] Foreign Application Priority Data

Jul. 31, 1995 [GB] United Kingdom .................... 9515651

[51] Int. Cl.⁶ ............................... H05K 3/30; H05K 3/36
[52] U.S. Cl. .............................. 29/830; 25/832; 257/700; 257/737; 361/719; 361/761
[58] Field of Search ............................ 29/832, 827, 830; 228/180.21, 180.22; 257/700, 678, 697, 692, 737, 738; 361/761, 762, 764, 792–795, 707, 719, 720

[56] References Cited

U.S. PATENT DOCUMENTS

| | | | |
|---|---|---|---|
| 4,285,002 | 8/1981 | Campbell | 29/827 |
| 4,689,103 | 8/1987 | Elarde | 29/849 |
| 5,159,750 | 11/1992 | Dutta et al. | 29/827 |
| 5,235,209 | 8/1993 | Shimizu et al. | 257/700 |
| 5,331,510 | 7/1994 | Ouchi et al. | 361/719 |
| 5,357,672 | 10/1994 | Newman | 29/830 |
| 5,420,460 | 5/1995 | MassingIll | 257/697 |
| 5,557,502 | 9/1996 | Banerjee et al. | 361/719 |
| 5,572,405 | 11/1996 | Wilson et al. | 361/764 |
| 5,578,796 | 11/1996 | Bhatt et al. | 361/794 |

*Primary Examiner*—P. W. Echols
*Attorney, Agent, or Firm*—Seed and Berry LLP

[57] ABSTRACT

The present invention proposes a method of manufacturing a ball grid array printed circuit board (210) that comprises the following steps: fabricating a printed circuit board, PCB, that comprises a matrix of ball grid array PCBs, each ball grid array PCB of the matrix is separated from its neighbors by the width of an electroplating tie bar (230); stamping the matrix of ball grid array PCBs for separating them and for forming an aperture (320) that is substantially centralized within each of them; preparing a metal sheet (510), onto which a semiconductor device (130) is mechanically attached; mechanically attaching a singularized ball grid array PCB to the metal sheet; and molding about the semiconductor device and a portion of the ball grid array PCB a protective material (140) that is substantially planar with respect to the ball grid array PCB.

25 Claims, 7 Drawing Sheets

5,819,398

METHOD OF MANUFACTURING A BALL GRID ARRAY PACKAGE

CROSS-REFERENCE TO RELATED APPLICATION

This application claims priority from GB 9515651.9, filed Jul. 31, 1995, which is hereby incorporated by reference. However, the content of the present application is not necessarily identical to that of the priority application.

BACKGROUND AND SUMMARY OF THE INVENTION

The present invention relates to packaging for semiconductor devices. More particularly, the present invention relates to leadless pad array packages that are commonly known as ball grid array (BGA) packages.

Ball grid array packages, have been introduced and developed over recent years. These packages have become popular primarily due to their high connection densities, low profiles and low costs. An example of a BGA package is described in U.S. Pat. No. 5,241,133 to Mullen, III et al., which is hereby incorporated by reference. See also, for example: Bauer, "Package assembly technology directions, *Semiconductor International*, vol.19, no.4, at 127 (April 1996); Prasad, "Technology driven component package trends," *Semiconductor International* vol.19 no.4 at 116 (April 1996); Schueller et al., "Design of a low-cost wire bond tape ball grid array package," *Circuit World* vol.22 no.3 at 10 (April–May 1996); the Proceedings of the International Electronics Packaging Conferences, for years 1990 to date; the Proceedings of the Technical Program of NEPCON WEST, for years 1990 to date; and the proceedings of the IEEE/CPMT International Electronics Manufacturing Technology Symposium, for years 1990 to date. All of these materials are hereby incorporated by reference in their entirety.

The figures referred to in the following text that illustrate various embodiments of the state of the art, and of the present invention, may incorporate the same or similar elements. Therefore, where the same or similar elements occur throughout the various figures, they will be designated in the same manner.

FIG. 1 illustrates a cross sectional view of a BGA package that incorporates a heatspreader.

The heatspreader 100 is attached to the topside of the uppermost printed circuit board (PCB) of a laminated PCB structure 110. The PCB structure is illustrated in this example as comprising three laminated PCBs. It should be understood that the PCB structure could also be a single sheet as opposed to a plurality of laminated sheets. The solder balls 120 are attached to the bottom-side of the lowermost PCB of the laminated PCB structure 110. The PCB structure 110 has a centralized opening that allows an integrated circuit 130 to be mechanically attached, and if required electrically attached, to the heatspreader 100. The integrated circuit 130 is electrically bonded to the PCB structure 110. And finally, it is normal practice to provide a protective, plastic based, material 140 to encapsulate the integrated circuit and seal the opening, i.e. the otherwise exposed integrated circuit.

A typical method for preparing and fabricating a BGA package, such as that illustrated in FIG. 1 for example, is described in U.S. Pat. No. 5,357,672 to Newman, which is hereby incorporated by reference.

However, one problem associated with the manufacturing of BGAs is that a considerable portion of the PCB material is completely wasted, i.e. the wasted material cannot be reclaimed. This wasted PCB material is directly attributable to the current methods of manufacturing BGA packages.

FIG. 2 illustrates a sheet of laminated PCBs 200 that comprises a N×M matrix of BGA printed circuit boards 210.

It should be noted that when there are two or more PCBs that constitute the laminated PCB structure, it is necessary that their respective central openings are created before they are laminated together. A birds-eye view illustrates the uppermost PCB as having the largest opening 240 and the lowermost PCB as having the smallest opening 260. The sandwiched PCB has an opening 250 that is larger than the smallest 260 and smaller than the largest 240.

Each BGA printed circuit board 210 has a series of connections 220 leading out from all four sides to tie bars 230. The tie bars 230 are arranged such that they form a single electrically conductive matrix. The tie bars 230 and the connections 220 to them are required so that electroplating can be carried out.

This electroplating process and the method and reasons for carrying it out are known to those skilled in the art. When the electroplating has been completed, it is necessary to electrically isolate each of the BGA printed circuit boards 210 from each other, i.e. electrically isolate the series of connections 220.

Traditionally, the sheet of PCBs 200 is stamped so as to not only electrically isolate each of the BGA printed circuit boards from each other but also to separate the N×M matrix of BGA printed circuit boards 210 into smaller more manageable matrices.

Because these smaller more manageable matrices need to be handled for positioning etc. they are provided with positioning holes and guides (not illustrated). In this typical illustrated example, the N×M matrix will be separated into a plurality of 1×M matrices along the axes A–A', as indicated by the dashed lines.

The relatively large gaps between the adjacent vertical sides of neighboring BGA printed circuit board 1×M matrices should be noted. These gaps, which will be referred to further on in the text, are necessary for present day manufacturing methods, but they are also the source of the substantial waste of non-recyclable PCB material.

FIG. 3 illustrates a plurality of electrically isolated BGA printed circuit board 1×M matrices.

FIG. 3 is in fact a stamped, or punched, version of FIG. 2. It can be seen that the connections 220 to the tie bars 230 have been completely isolated from each other by the stamping of relatively large elongated holes 300. Also illustrated in this figure are: the guide holes 310 that are required for handling purposes; the alignment holes 315 used for when each individual BGA printed circuit board 210 is separated; and a vertical stamp or cut line indicating where the 1×M matrices are separated. It should be noted that if a single PCB structure was being used, as opposed to a laminated PCB structure, then the opening could be made during the stamping out of the tie bars etc.

The vertical elongated holes 300 and the guide holes 310 are analogous to those that are found on the edges of photographic film. Each of the elongated holes 300 has to be enclosed within a separated 1×M matrix. Therefore, the distance d between the outside edges of adjacent elongated holes 300 in the same row of the N×M matrix must be at least twice the margin m between the outside edge of an elongated hole 300 and the separated 1×M column.

This method of manufacturing BGA packages requires the PCB to be cut into 1×M strips and mechanically handled and positioned by means of guide holes. The metal slugs (100) are individually separated and placed onto the PCB strips by means of pick and place machinery. The PCB strips are then punched at the corners of each of the main areas 210 thus creating the type of package as shown in FIG. 1.

Therefore, because the BGA printed circuit boards 210 are traditionally handled in 1×M strips, there is a considerable amount of waste PCB material. The inventor believes that between approximately 30% and 40% of the initial PCB sheet is completely wasted and presently PCB material cannot be recycled.

Furthermore, if during the initial evaluation of quality, continuity etc. of the 1×M strips there is found to be at least one BGA printed circuit board 210 that is in some way defective, then the whole 1×M strip is discarded. Therefore, for this one defective BGA printed circuit board 210 in a 1×M strip, a total of (1×M )−1 BGA printed circuit boards 210 will be unnecessarily discarded. Such discarding will have a dramatic effect upon the yield of BGA printed circuit boards 210.

Accordingly, an object of the present invention is to provide a method of manufacturing a printed circuit board that reduces the amount of non-recyclable waste material.

According to the present invention, a process opposite that of the prior art is carried out in terms of separating and cutting into 1×M strips. That is to say, the PCB structures are individually separated while the metal slugs are punched into 1×M strips. The advantages of manufacturing a BGA package according to the present invention include: less waste of non-recyclable PCB waste material; a greater portion of waste metal that is recyclable, less expensive toolings, etc.

Another object of the present invention is to provide a method of manufacturing a printed circuit board that results in reduced manufacturing costs.

Another object of the present invention is to reduce the complexity of printed circuit board tooling equipment.

Another object of the present invention is to increase the yield in the number of working printed circuit boards.

In order to achieve these objects, the present invention proposes a method of manufacturing a ball grid array printed circuit board, that includes the following steps: fabricating a printed circuit board that includes a matrix of ball grid array printed circuit boards, each ball grid array printed circuit board of the matrix being substantially the final desired size and being separated from its neighbors by a distance that substantially corresponds to only the width of an electroplating tie bar; stamping the matrix of ball grid array printed circuit boards for separating each of the ball grid array printed circuit boards and for forming an aperture that is substantially centralized within each of the separated ball grid array printed circuit boards; preparing a metal sheet, onto which a semiconductor device is mechanically attached; mechanically attaching a separated ball grid array printed circuit board to the metal sheet; and molding about the semiconductor device and a portion of the ball grid array printed circuit board a protective material that is substantially planar with respect to the ball grid array printed circuit board. Alternatively, the separated ball grid array printed circuit board can be mechanically attached to the metal sheet before mechanically attaching the semiconductor device onto the prepared metal sheet.

According to another embodiment of the present invention a plurality of operatively corresponding printed circuit boards are fabricated wherein apertures are formed, that have different dimensions with respect to each other, within each of the plurality of printed circuit boards. The plurality of operatively corresponding printed circuit boards are laminated so as to form a matrix of ball grid array printed circuit boards. Then the matrix of ball grid array printed circuit boards is stamped so as to separated each of the ball grid array printed circuit boards. It should be noted that the printed circuit board that is destined to have the smallest aperture can have its aperture stamped out during the separating of the ball grid array printed circuit boards as opposed to before lamination.

According to another embodiment of the present invention the prepared metal sheet is substantially planer.

According to another embodiment of the present invention the prepared metal sheet includes an indent, wherein the semiconductor device is mechanically attached.

According to another embodiment of the present invention the prepared metal sheet is substantially the same size as a separated ball grid array printed circuit board.

According to another embodiment of the present invention the prepared metal sheet substantially envelopes the sides of the ball grid array printed circuit board.

According to other embodiments of the present invention a plurality of metal sheets are prepared at the same time and are prepared as a matrix of solid leadframes.

According to another embodiment of the present invention the respective steps of mechanically attaching, to the prepared metal sheet, the semiconductor device and the separated ball grid array printed circuit board also include the respective steps of electrically attaching, to the prepared metal sheet, the semiconductor device and the separated ball grid array printed circuit board.

According to another embodiment of the present invention the prepared metal sheet is greater than approximately 0.1 millimeters.

According to another embodiment of the present invention the prepared metal sheet is approximately 0.25 millimeters.

According to other embodiments of the present invention the prepared metal sheet can be manufactured from copper, a copper alloy, aluminum or an aluminum alloy.

According to another embodiment of the present invention a plurality of ball grid array printed circuit boards that has been manufactured according to any of the previous embodiments are attached to a common support, for example a printed circuit board.

According to another embodiment of the present invention there is provided a method of manufacturing a ball grid array (BGA) printed circuit board, comprising the steps of: fabricating a printed circuit board having a matrix of BGA printed circuit boards, each BGA printed circuit board of said matrix being separated from adjacent BGA printed circuit boards by a distance that substantially corresponds to only the width of an electroplating tie bar; forming an aperture that is substantially centralized within each of the BGA printed circuit boards; separating said matrix of BGA printed circuit boards into individual BGA printed circuit boards; mechanically attaching a semiconductor device onto a prepared metal sheet; mechanically attaching one of said individual BGA printed circuit board to said metal sheet; and encapsulating said semiconductor device and a portion of said individual BGA printed circuit board in a protective material.

According to another embodiment of the present invention there is provided a method of manufacturing a ball grid array (BGA) printed circuit board, comprising the steps of:

fabricating a plurality of operatively corresponding printed circuit boards; forming apertures of different dimensions with respect to each other within each of the plurality of printed circuit boards; laminating said plurality of operatively corresponding printed circuit boards so as to form a matrix of BGA printed circuit boards; forming an aperture that is substantially centralized within each of the BGA printed circuit boards; separating said matrix of BGA printed circuit boards into individual BGA printed circuit boards; mechanically attaching a semiconductor device onto a prepared metal sheet; mechanically attaching one of said individual BGA printed circuit board to said metal sheet; and encapsulating said semiconductor device and a portion of said individual BGA printed circuit board in a protective material.

According to another embodiment of the present invention there is provided an integrated circuit package comprising: a multilayer structure of multiple printed circuit board portions stacked together, said multiple printed circuit boards portions defining at least one aperture therein; a heat spreader plate adhered to a first side of said multilayer structure of printed circuit board portions; a plurality of metallic connection elements on a second side of said multilayer structure, which is opposite to said first side; an integrated circuit located in said aperture and adhered to said heat spreader, said integrated circuit being connected to said connection elements by bond wires and by metallic portions within said multilayer structure; wherein said heat spreader plate is not completely planar, but includes a central planar portion which is adhered both to said integrated circuit and to said multilayer structure surrounding said integrated circuit, and also includes a downset portion which envelops the sides of said multilayer structure.

According to another embodiment of the present invention there is provided an integrated circuit package comprising: a multilayer structure of multiple printed circuit board portions stacked together, said multiple printed circuit boards portions defining at least one aperture therein; a heat spreader plate adhered to a first side of said multilayer structure of printed circuit board portions; a plurality of metallic connection elements on a second side of said multilayer structure, which is opposite to said first side; an integrated circuit located in said aperture and adhered to said heat spreader, said integrated circuit being connected to said connection elements by bond wires and by metallic portions within said multilayer structure; wherein said heat spreader plate includes a first planar portion which is adhered to said integrated circuit but not to said multilayer structure, and includes a second portion, which laterally surrounds and is parallel to said first planar portion but is not coplanar therewith and is adhered both to said integrated circuit and to said multilayer structure surrounding said integrated circuit, and also includes a downset portion which envelops the sides of said multilayer structure.

BRIEF DESCRIPTION OF THE DRAWING

These and other objects, as well as other advantages and features, of the present invention will become apparent in light of the following detailed description and accompanying drawings among which.

DETAILED DESCRIPTION OF THE PREFERRED EMBODIMENTS

Figure 4:
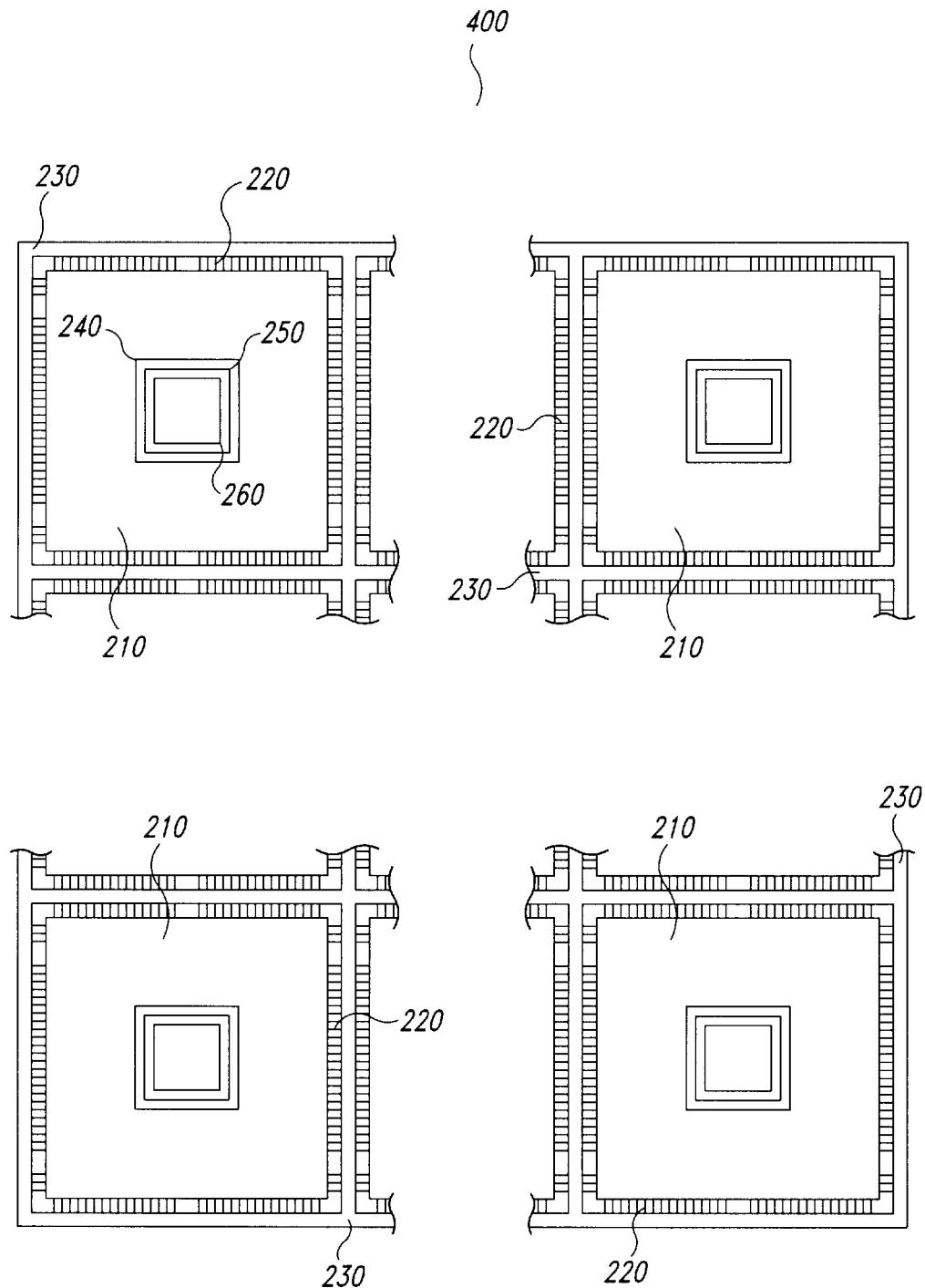
FIG. 4 illustrates a solid sheet of PCB material that comprises a matrix of BGA printed circuit boards 210 according to the present invention.

The numerous innovative teachings of the present application will be described with particular reference to the presently preferred embodiment (by way of example, and not of limitation), in which:

FIG. 4 illustrates a solid sheet of PCB material 400 that comprises a N×M matrix of BGA printed circuit boards 210 according to the present invention.

The present invention provides a new method for fabricating a ball grid array, in which the traditional order of assembly is reversed: the PCB boards are assembled onto the metal heat spreader plate, rather than vice versa. Space for alignment holes is not required in the array of PCB material; instead, alignment holes are included in the metal from which the heat spreader plates are cut. This provides a simpler and more economical fabrication process, because punching metal is easier than punching PCB board. Moreover, metal scraps are easier to recycle.

One of the advantages associated with the present invention is that the actual preparation and method of fabrication of the sheet 400 of BGA printed circuit boards 210 is the same as it is for the sheet 200.

The present invention proposes a method of preparing and fabricating the sheet 400 of BGA printed circuit boards 210 by substantially the same, or similar, methods as illustrated in, and associated with, U.S. Pat. No. 5,357,672 to Newman, incorporated by reference above.

According to the present invention, the area of the sheet 400 is substantially equal to the total area of the final desired area of each of the BGA printed circuit boards 210 of the N×M matrix.

Figure 3:
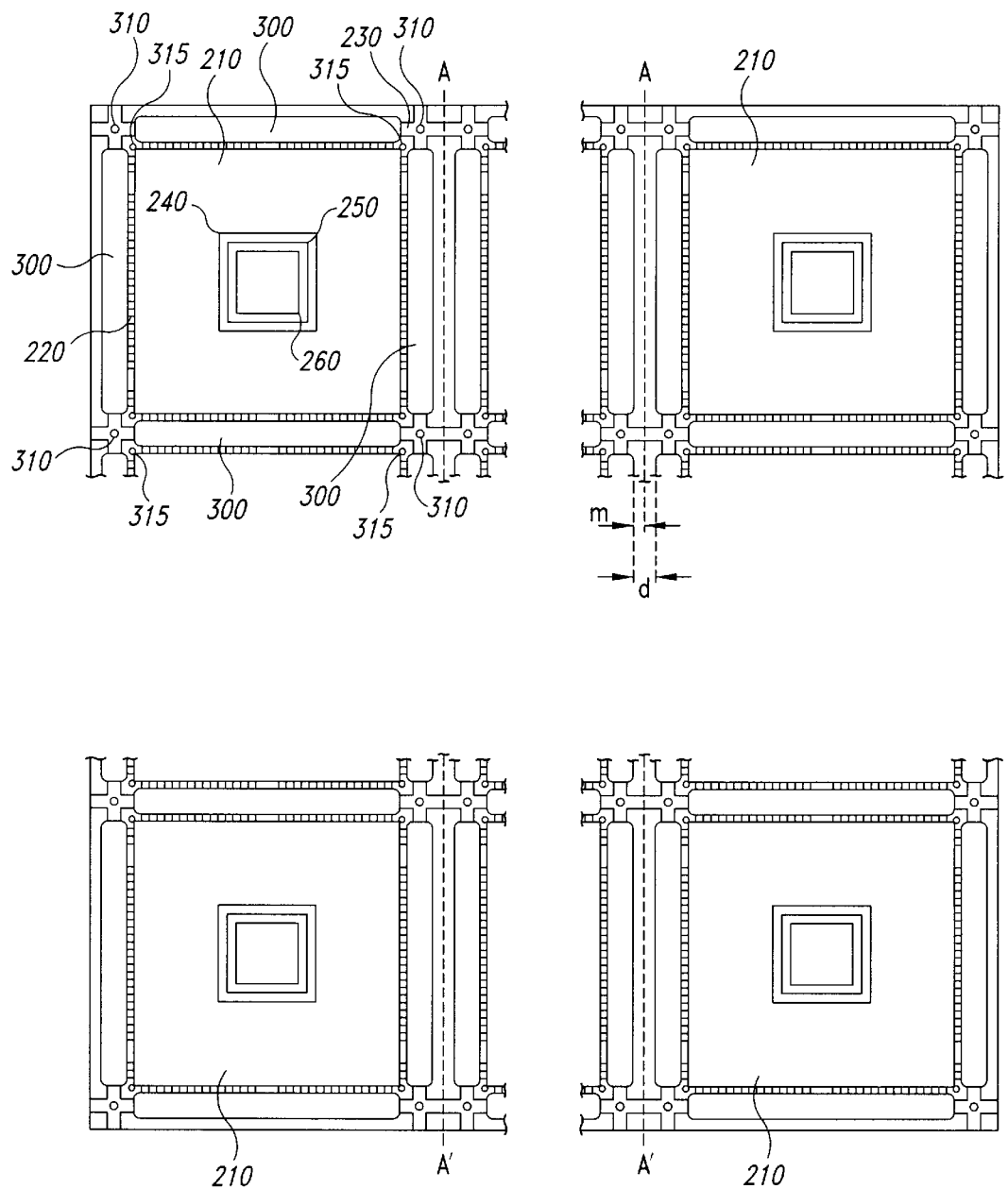
FIG. 3 illustrates already depicted electrically isolated BGA printed circuit board 1×M matrices.

It can been seen, by comparison with FIG. 3, that the BGA printed circuit boards 210 in this present illustration are in much closer proximity to each of their neighboring BGA printed circuit boards. This closer proximity arises from the fact that the manufacturing process according to the present invention does not require the positioning holes, guide holes and large elongated holes, and their associated spacings, of FIG. 3, which were necessary for the handling and processing purposes.

As a result, the connections 220 to the tie bars can be substantially small, for example 1 or 2 millimeters: thus each of the BGA printed circuit boards 210 has an area, inside its associated tie bar perimeter, that is substantially equal to its final desired area. Thus, each of the BGA printed circuit boards 210 is separated from its neighbors by a distance that substantially corresponds to only the width of the electroplating tie bar 230, as can be seen. Therefore, the wasted non-recyclable PCB material is kept to a minimum. In fact the wasted non-recyclable PCB material is little more than that covered by the tie bar matrix 230. If the width of the tie bars, that makes up the tie bar matrix, can be reduced, the amount of waste PCB material will be even less.

Having produced the sheet 400, each BGA printed circuit board is separated, preferably in the case of a non-laminated PCB, at the same time as forming a centralized opening within each of the BGA array printed circuit boards.

According to the present invention, the tooling equipment used to stamp the sheet 400 does not have to have the same degree of complexity, and the increased costs associated with this complexity, as that which is associated with the sheet 200.

Figure 5:
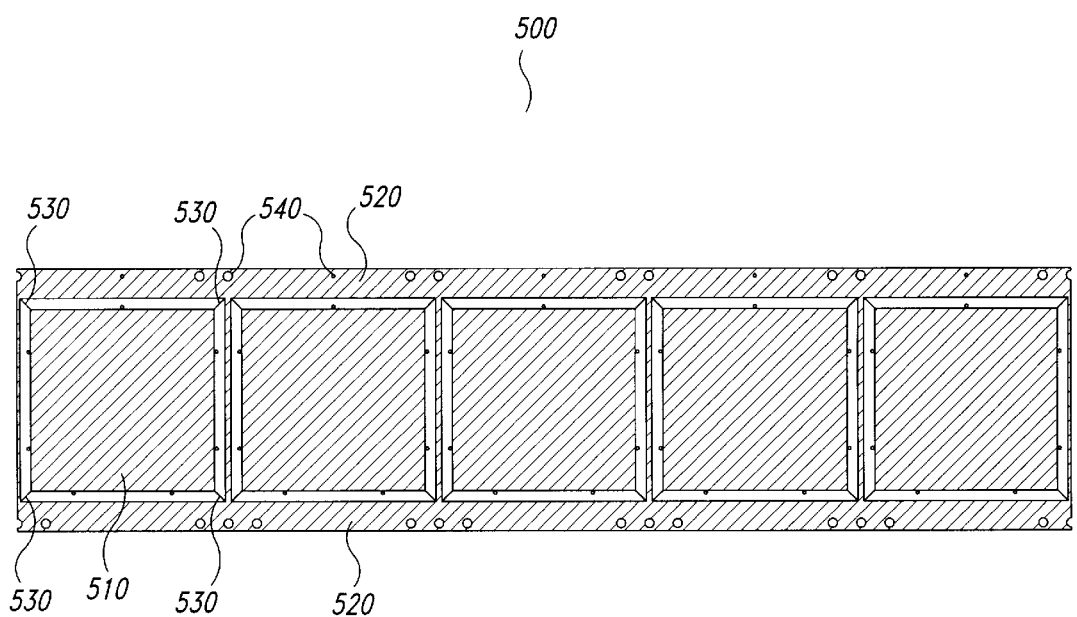
FIG. 5 illustrates a solid lead frame according to the present invention.

FIG. 5 illustrates a solid lead frame used according to the present invention.

Traditionally lead frames are fabricated out of strips of copper or some other suitable metal or alloy. The metal/alloy strips are prepared by stamping and where necessary downsetting, bending etc.

According to the present invention, it is only necessary to prepare a 1×M strip leadframe 500 that has a solid central metal/alloy plate 510, the plate being intended to act as the required heatspreader. This heatspreader 510 is attached to the leadframe side rails 520 by suitably placed attachment bars 530. All of the metal/alloy material associated with this leadframe 500 is either used or can be fully recycled. Thus, the present invention allows the substitution of a substantial portion of the amount of non-recyclable waste materials for recyclable waste materials.

According to the present invention, the side rails 520 of the leadframe 500 have all the necessary guide and alignment holes 540. The thickness of the heatspreader 510 can be chosen depending upon the thermal environment and the thermal management requirements of its intended application. The thickness of the heatspreader 510 is typically greater than approximately 0.1 millimeters. However, according to the present invention, it is preferable that the thickness of the heatspreader is approximately 0.25 millimeters.

Having now produced a sheet of PCB 400 and a leadframe 500 according to the present invention, the assembly process can begin. There exist many different assembly methods known to those who are skilled in the art that may involve different techniques and/or sequences. Therefore, it must be stressed that the following description is only intended as an exemplification and is intended to be non-limiting.

The leadframe 500 is positioned by a suitable operator, i.e. handler, and a semiconductor device is mechanically attached to each of the prepared leadframes, i.e. heatspreaders. The semiconductor devices may or may not be electrically connected to the prepared leadframe. However it is common practice to make the electrical connection between the semiconductor substrate, for example, by means of conductive glue or by wire bonding.

Individual BGA printed circuit boards 210 are positioned and then operatively attached, whether by means of an adhesive or by solder, to the prepared leadframe or leadframes. Preferably, it is more efficient to simultaneously position and attach a plurality of individual BGA printed circuit boards 210 to a plurality of prepared leadframes 500.

There are many apparatus, for example 'pick and place' apparatus, which are widely available and that are capable of effectively handling and coordinating the positioning and union of the separated BGA printed circuit boards 210 and the prepared leadframes.

Figure 1:
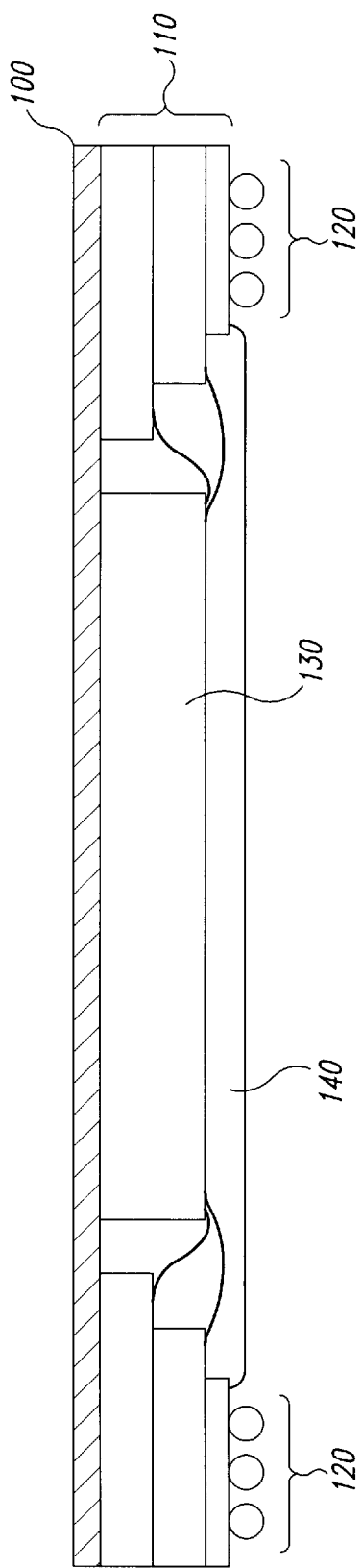
FIG. 1 illustrates a prior art cross sectional view of a BGA package that incorporates a heatspreader.
Figure 2:
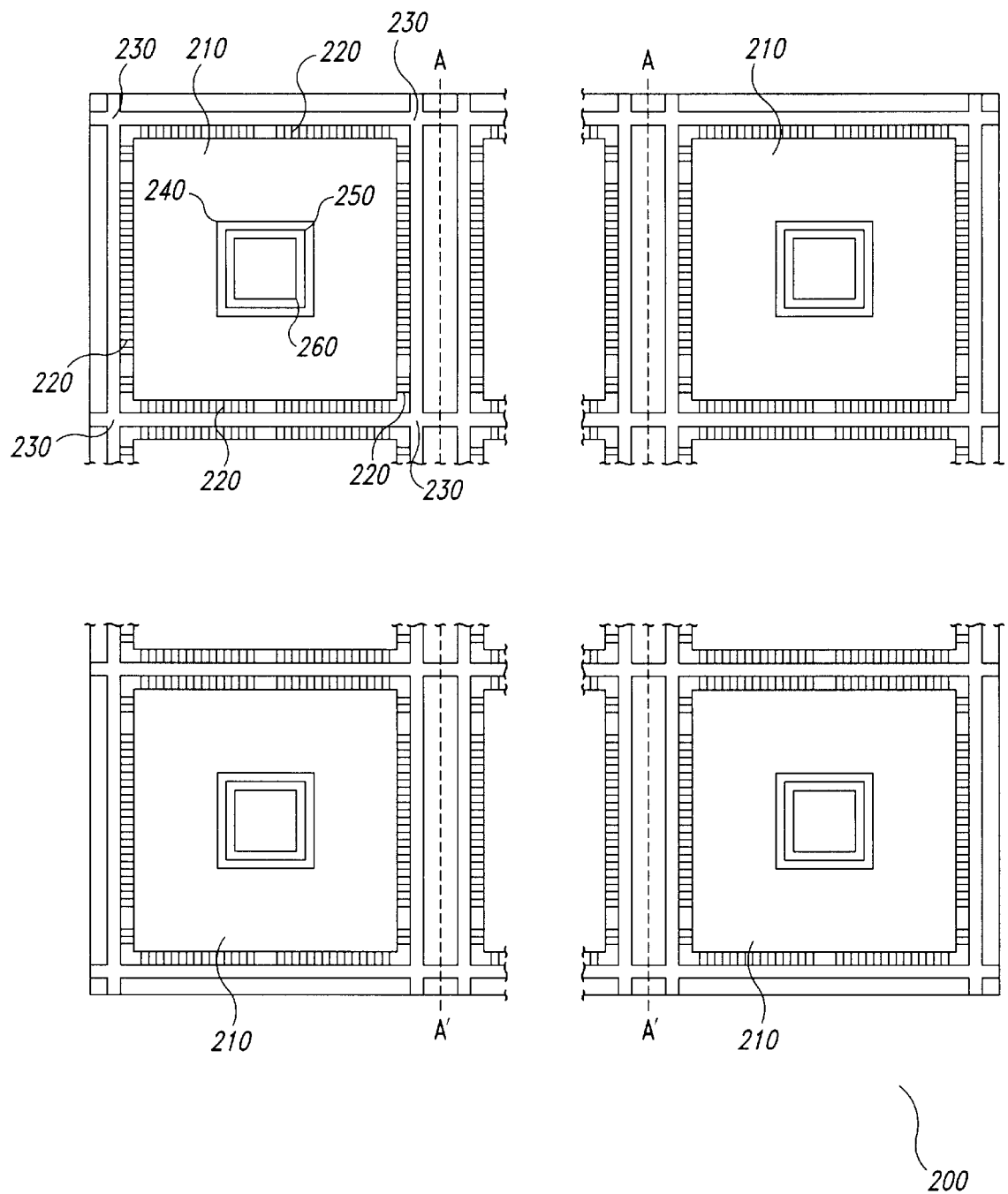
FIG. 2 illustrates an already depicted sheet of PCB material that comprises a matrix of BGA printed circuit boards.

Even though the present invention can be used to manufacture a BGA package substantially similar to that of FIG. 1, it is preferable, according to the present invention, to envelope the sides of the laminated PCB structure 110 by downsetting, i.e. indenting, the heatspreader. This enveloping will assist in reducing the amount or radiated electromagnetic interference (EMI), especially if the heatspreader is electrically grounded.

Figure 6:
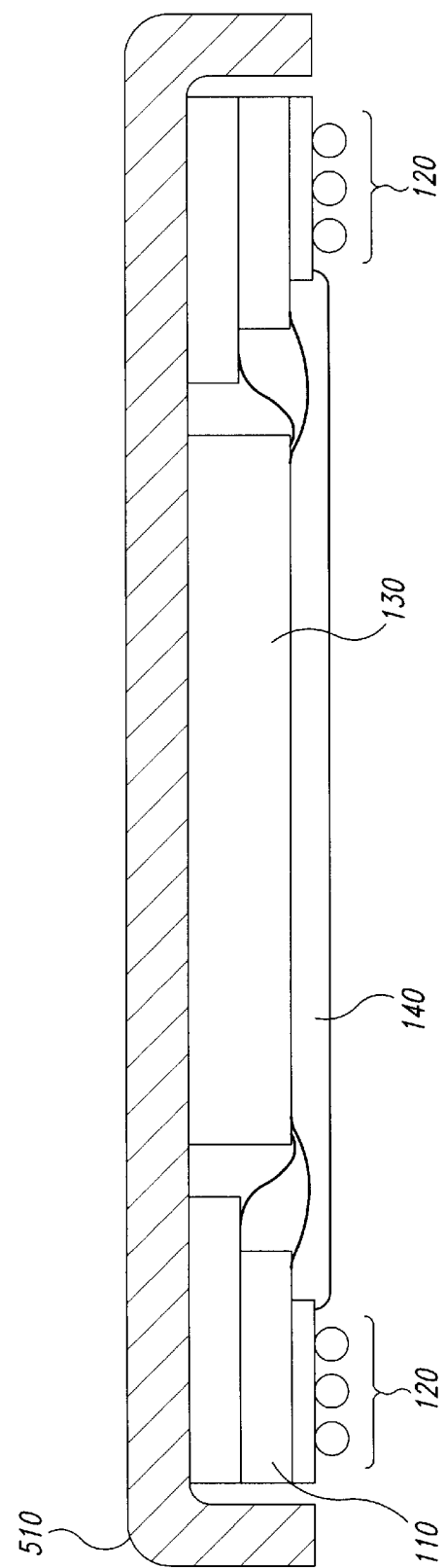
FIG. 6 illustrates a cross sectional view of a BGA package according to the present invention that incorporates a downset heatspreader.

FIG. 6 illustrates a cross sectional view of a laminated printed circuit board BGA package that incorporates a heatspreader 510 that has been downset such that the outer perimeter of this heatspreader 510 surrounds or envelopes the sides of the laminated PCB structure.

Figure 7:
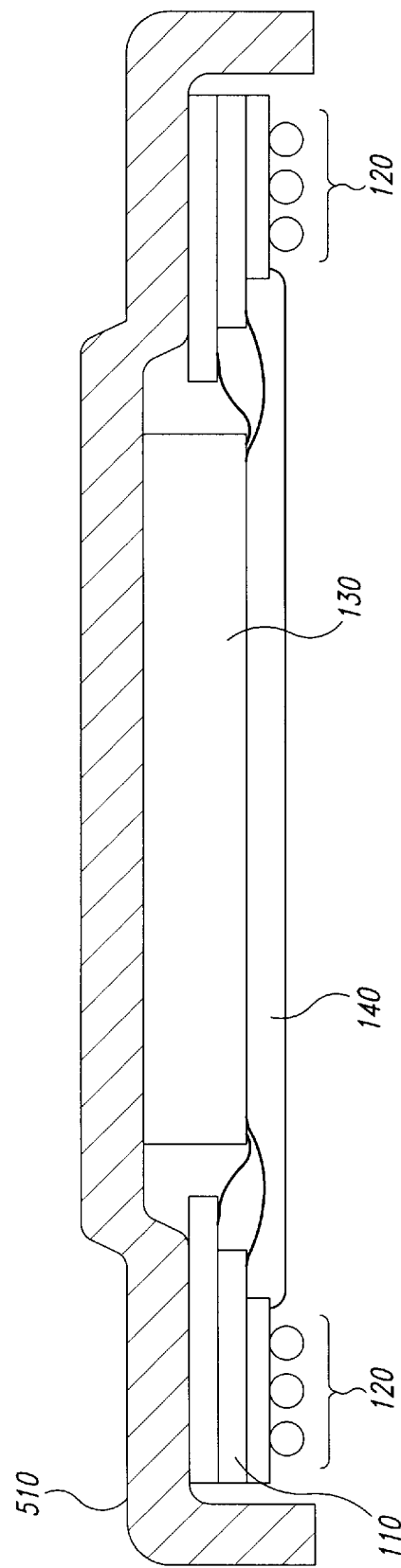
FIG. 7 illustrates a cross sectional view of the BGA package of FIG. 6 that incorporates an additional centralized downset.

According to the present invention as illustrated in FIG. 7, it is also preferable to downset a substantially central portion of the heatspreader in addition to downsetting so as to envelope the sides of the laminated PCB structure 110. A substantially central downset allows the thickness of the PCB layers to be reduced and/or the thickness of the integrated circuit to be increased. An advantage of being able to introduce an integrated circuit with a greater thickness is that it avoids the need for a back lapping process step during wafer processing. Additionally a substantially central downset helps to strengthen the overall structure.

FIG. 7 illustrates a cross sectional view of a BGA package that incorporates a heatspreader 510 that has a substantially central portion that has been downset, the semiconductor device being attached within this central downset portion, in addition to the downsetting so as to envelope the sides of the laminated PCB structure 110.

Both FIGS. 6 and 7 illustrate a protective material 140 that encapsulates the integrated circuit and seals the opening. The protective material 140 is substantially planar with respect to the bottom-side of the lowermost PCB of the laminated PCB structure 110.

Even though the present invention has focused upon a laminated printed circuit board BGA with central openings it can also be adapted to BGA printed circuit boards that do not have a central opening or indeed any other printed circuit board, whatever its application.

Although this invention has been described in connection with certain preferred embodiments, it should be understood that the present disclosure is to be considered as an exemplification of the principles of the invention and that there is no intention of limiting the invention to the disclosed embodiments. On the contrary, it is intended that all alternatives, modifications and equivalent arrangements as may be included within the spirit and scope of the appended claims be covered as part of this invention.

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

What is claimed is:

1. A method of manufacturing a ball grid array printed circuit board, comprising the following steps:

fabricating a matrix of ball grid array printed circuit boards, each ball grid array printed circuit board of the matrix being substantially the final desired size and being separated from its neighbors by only an electroplating tie bar;

forming an aperture that is substantially centralized within each of the ball grid array printed circuit boards;

stamping the matrix of ball grid array printed circuit boards to separate each of the ball grid array printed circuit boards;

preparing a metal sheet, onto which a semiconductor device is mechanically attached;

mechanically attaching a separated ball grid array printed circuit board to the metal sheet; and molding about the semiconductor device and a portion of the ball grid array printed circuit board a protective material that is substantially planar with respect to the ball grid array printed circuit board.

2. The method of manufacturing a ball grid array printed circuit board of claim 1, characterized in that the prepared metal sheet is substantially planar.

3. The method of manufacturing a ball grid array printed circuit board of claim 1, characterized in that the prepared metal sheet includes an indent, wherein the semiconductor device is mechanically attached.

4. The method of manufacturing a ball grid array printed circuit board of claim 1, characterized in that the prepared metal sheet is substantially the same size as a separated ball grid array printed circuit board.

5. The method of manufacturing a ball grid array printed circuit board of claim 1, characterized in that the prepared metal sheet substantially envelopes the sides of the ball grid array printed circuit board.

6. The method of manufacturing a ball grid array printed circuit board of claim 1, characterized in that a plurality of metal sheets are prepared at the same time.

7. The method of manufacturing a ball grid array printed circuit board of claim 6, characterized in that the plurality of metal sheets are prepared as a matrix of heatspreaders with solid center plates.

8. The method of manufacturing a ball grid array printed circuit board of claim 1, characterized in that the respective steps of mechanically attaching, to the prepared metal sheet, the semiconductor device and the separated ball grid array printed circuit board also include the respective steps of electrically attaching, to the prepared metal sheet, the semiconductor device and the separated ball grid array printed circuit board.

9. The method of manufacturing a ball grid array printed circuit board of claim 1, characterized in that the thickness of the prepared metal sheet is greater than approximately 0.1 millimeters.

10. The method of manufacturing a ball grid array printed circuit board of claim 1, characterized in that the thickness of the prepared metal sheet is approximately 0.25 millimeters.

11. The method of manufacturing a ball grid array printed circuit board of claim 1, characterized in that the prepared metal sheet is manufactured from copper or a copper alloy.

12. The method of manufacturing a ball grid array printed circuit board of claim 1, characterized in that the prepared metal sheet is manufactured from aluminum or an aluminum alloy.

13. A method of manufacturing a ball grid array (BGA) printed circuit board, comprising the steps of:

fabricating a matrix of BGA printed circuit boards, each BGA printed circuit board of said matrix being separated from adjacent BGA printed circuit boards by a distance that substantially corresponds to only the width of an electroplating tie bar;

forming an aperture that is substantially centralized within each of the BGA printed circuit boards;

separating said matrix of BGA printed circuit boards into individual BGA printed circuit boards;

mechanically attaching a semiconductor device onto a prepared metal sheet;

mechanically attaching one of said individual BGA printed circuit board to said metal sheet; and encapsulating said semiconductor device and a portion of said individual BGA printed circuit board in a protective material.

14. The method of claim 13, wherein said prepared metal sheet is substantially planar.

15. The method of claim 13, wherein said prepared metal sheet includes an indent, wherein the semiconductor device is mechanically attached.

16. The method of claim 13, wherein said prepared metal sheet is substantially the same size as said individual BGA printed circuit board.

17. The method of claim 13, wherein said prepared metal sheet substantially envelops the sides of said individual BGA printed circuit board.

18. The method of claim 13, wherein a plurality of metal sheets are prepared at the same time.

19. The method of claim 18, wherein said plurality of metal sheets are prepared as a matrix of heatspreaders with solid center plates.

20. The method of claim 13, wherein said semiconductor device and said BGA printed circuit board are also electrically connected to said prepared metal sheet.

21. The method of claim 13, wherein said prepared metal sheet thickness is greater than approximately 0.1 millimeters.

22. The method of claim 13, wherein said prepared metal sheet thickness is approximately 0.25 millimeters.

23. The method of claim 13, wherein said prepared metal sheet is manufactured from copper or a copper alloy.

24. The method of claim 13, wherein said prepared metal sheet is manufactured from aluminum or an aluminum alloy.

25. A method of manufacturing a ball grid array (BGA) printed circuit board, comprising the steps of:

fabricating a plurality of printed circuit boards of like dimensions;

forming an aperture within each said printed circuit board, wherein each said aperture is of a dimension different from any other said aperture of any other printed circuit board;

laminating said printed circuit boards to form a matrix of BGA printed circuit boards;

separating said matrix of BGA printed circuit boards into individual BGA printed circuit boards;

mechanically attaching a semiconductor device onto a prepared metal sheet;

mechanically attaching one of said individual BGA printed circuit board to said metal sheet; and encapsulating said semiconductor device and a portion of said individual BGA printed circuit board in a protective material.

* * * * *